US012622258B2

(12) United States Patent
    Reshotko et al.

(10) Patent No.: US 12,622,258 B2
(45) Date of Patent: May 5, 2026

(54) SELF-ALIGNED STAGGERED INTEGRATED CIRCUIT INTERCONNECT FEATURES

(71) Applicant: Intel Corporation, Santa Clara, CA (US)

(72) Inventors: Miriam Reshotko, Portland, OR (US); Elijah Karpov, Portland, OR (US); Mark Anders, Hillsboro, OR (US); Gauri Auluck, Hillsboro, OR (US); Shakuntala Sundararajan, Hillsboro, OR (US); Michael Makowski, Sherwood, OR (US); Caleb Barrett, Ridgefield, WA (US)

(73) Assignee: Intel Corporation, Santa Clara, CA (US)

( * ) Notice: Subject to any disclaimer, the term of this patent is extended or adjusted under 35 U.S.C. 154(b) by 13 days.

(21) Appl. No.: 17/833,708

(22) Filed: Jun. 6, 2022

(65) Prior Publication Data

US 2023/0395506 A1     Dec. 7, 2023

(51) Int. Cl.
    *H01L 23/532*     (2006.01)
    *H01L 21/768*     (2006.01)
    *H01L 23/522*     (2006.01)

(52) U.S. Cl.
    CPC .. *H01L 23/53238* (2013.01); *H01L 21/76843* (2013.01); *H01L 21/76877* (2013.01); *H01L 23/5226* (2013.01); *H01L 23/53266* (2013.01)

(58) Field of Classification Search
    CPC ......... H01L 23/53238; H01L 21/76843; H01L 21/76877; H01L 23/5226; H01L 23/53266;
    (Continued)

(56)         References Cited

U.S. PATENT DOCUMENTS 9,054,164 B1     6/2015   Jezewski et al.
9,330,974 B2     5/2016   Kim et al.
                 (Continued)

FOREIGN PATENT DOCUMENTS

EP      3968364      3/2022
EP      4145498      3/2023

OTHER PUBLICATIONS

Non-Published, U.S. Appl. No. 16/911,879, filed Jun. 25, 2020, 4 pgs.
                 (Continued)

*Primary Examiner* — Karen Kusumakar
(74) *Attorney, Agent, or Firm* — Essential Patents Group, LLP

(57)         ABSTRACT

Adjacent interconnect features are in staggered, vertically spaced positions, which accordingly reduces their capacitive coupling within a level of interconnect metallization. Adjacent interconnect features may comprise a plurality of first interconnect lines with spaces therebetween. A dielectric material is over the first interconnect lines and within the spaces between the first interconnect lines. Resultant topography in the dielectric material defines a plurality of trenches between the first interconnect lines. The adjacent interconnect features further comprise a plurality of second interconnect lines interdigitated with the first interconnect lines that occupy at least a portion of the trenches between individual ones of the first interconnect lines.

20 Claims, 9 Drawing Sheets

(58) Field of Classification Search
    CPC ........... H01L 23/5283; H01L 21/76885; H01L 21/76816
    See application file for complete search history.

(56) References Cited

U.S. PATENT DOCUMENTS

| | | | |
|---|---|---|---|
| 9,385,082 | B2 | 7/2016 | Jezewski et al. |
| 9,805,972 | B1 | 10/2017 | Zhang et al. |
| 9,911,694 | B2 | 3/2018 | Jezewski et al. |
| 10,026,687 | B1 | 7/2018 | Lin et al. |
| 10,366,950 | B2 | 7/2019 | Lin et al. |
| 11,004,790 | B2 | 5/2021 | Briggs et al. |
| 11,380,617 | B2 | 7/2022 | Jezewski et al. |
| 11,444,024 | B2 | 9/2022 | Lin et al. |
| 11,538,749 | B2 | 12/2022 | Lee et al. |
| 12,027,458 | B2 | 7/2024 | Lin et al. |
| 12,211,786 | B2 | 1/2025 | Wei et al. |
| 2014/0024146 | A1 | 1/2014 | Anzola et al. |
| 2015/0179515 | A1 | 6/2015 | Jezewski et al. |
| 2015/0243599 | A1 | 8/2015 | Jezewski et al. |
| 2015/0294933 | A1* | 10/2015 | We .................... H01L 23/5283 |
| | | | 438/624 |
| 2016/0315046 | A1 | 10/2016 | Jezewski et al. |
| 2017/0263553 | A1 | 9/2017 | Schenker et al. |
| 2017/0278796 | A1 | 9/2017 | Briggs et al. |
| 2017/0330761 | A1 | 11/2017 | Chawla et al. |
| 2018/0076133 | A1* | 3/2018 | Bonilla ............ H01L 21/76877 |
| 2018/0182702 | A1 | 6/2018 | Jezewski et al. |
| 2018/0204797 | A1 | 7/2018 | Lin et al. |
| 2019/0244806 | A1 | 8/2019 | Bristol et al. |
| 2020/0098619 | A1 | 3/2020 | Marieb et al. |
| 2020/0388565 | A1 | 12/2020 | Lin et al. |
| 2020/0411427 | A1 | 12/2020 | Lin et al. |
| 2021/0118693 | A1 | 4/2021 | Joy et al. |
| 2021/0296169 | A1 | 9/2021 | Philip et al. |
| 2021/0407895 | A1 | 12/2021 | Lin et al. |
| 2022/0139823 | A1 | 5/2022 | Lin et al. |
| 2022/0157711 | A1 | 5/2022 | Lee et al. |
| 2022/0199516 | A1 | 6/2022 | Chebiam et al. |
| 2022/0270964 | A1 | 8/2022 | Jezewski et al. |
| 2022/0352068 | A1 | 11/2022 | Lin et al. |
| 2022/0359385 | A1 | 11/2022 | Lee et al. |
| 2022/0415818 | A1 | 12/2022 | Naylor et al. |
| 2023/0065583 | A1* | 3/2023 | Lo ..................... H01L 21/76885 |
| 2023/0197602 | A1 | 6/2023 | Karpov et al. |
| 2023/0395506 | A1 | 12/2023 | Reshotko et al. |
| 2023/0402369 | A1 | 12/2023 | Chang |
| 2024/0038314 | A1 | 2/2024 | Chang |
| 2024/0105598 | A1 | 3/2024 | Guler et al. |
| 2024/0222270 | A1 | 7/2024 | Chang |
| 2024/0304543 | A1 | 9/2024 | Lin et al. |

OTHER PUBLICATIONS

Non-Published, U.S. Appl. No. 17/017,735, filed Sep. 11, 2020.
Non-Published, U.S. Appl. No. 17/031,825, filed Sep. 24, 2020.
Extended European Search Report from European Patent Application No. 23171920.4 notified Nov. 2, 2023, 10 pgs.

* cited by examiner

100

SELF-ALIGNED STAGGERED INTEGRATED CIRCUIT INTERCONNECT FEATURES

BACKGROUND

Demand for higher performance integrated circuits (ICs) in electronic device applications has motivated increasingly dense transistor architectures. Interconnect parasitics become a greater challenge as the density of interconnect metallization structures keeps pace with transistor density. For example, the resistance-capacitance (RC) delay associated with interconnects of an IC increase with the density of the interconnects. Large energy delay products attributable to line-to-line capacitance leads to higher power consumption and degraded performance.

Low-k interlevel dielectric materials and air gap solutions have been enlisted to lower interconnect capacitance. However, low-K ILDs are difficult to pattern and often do not maintain their low relative permittivity characteristics after typical fabrication processes, making such materials hard to integrate into high volume manufacturing. Air gap solutions often require extra patterning processes, which can significantly increase manufacturing cost. The implementation of air gaps can also compromise mechanical stability of an IC device.

Accordingly, interconnect structures, and techniques for fabricating such structures, with reduced capacitive coupling between nearest interconnect lines of a given lateral line pitch would be commercially advantageous over alternative techniques and structures.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements.

Although the figures may illustrate embodiments where structures are substantially aligned to Cartesian axes (e.g., device structures having substantially vertical sidewalls), positive and negative (re-entrant) sloped feature sidewalls often occur in practice. For example, manufacturing non-idealities may cause one or more structural features to have sloped sidewalls. Thus, attributes illustrated are idealized merely for the sake of clearly describing salient features. In the figures.

DETAILED DESCRIPTION OF EXEMPLARY EMBODIMENTS

Figure 1:
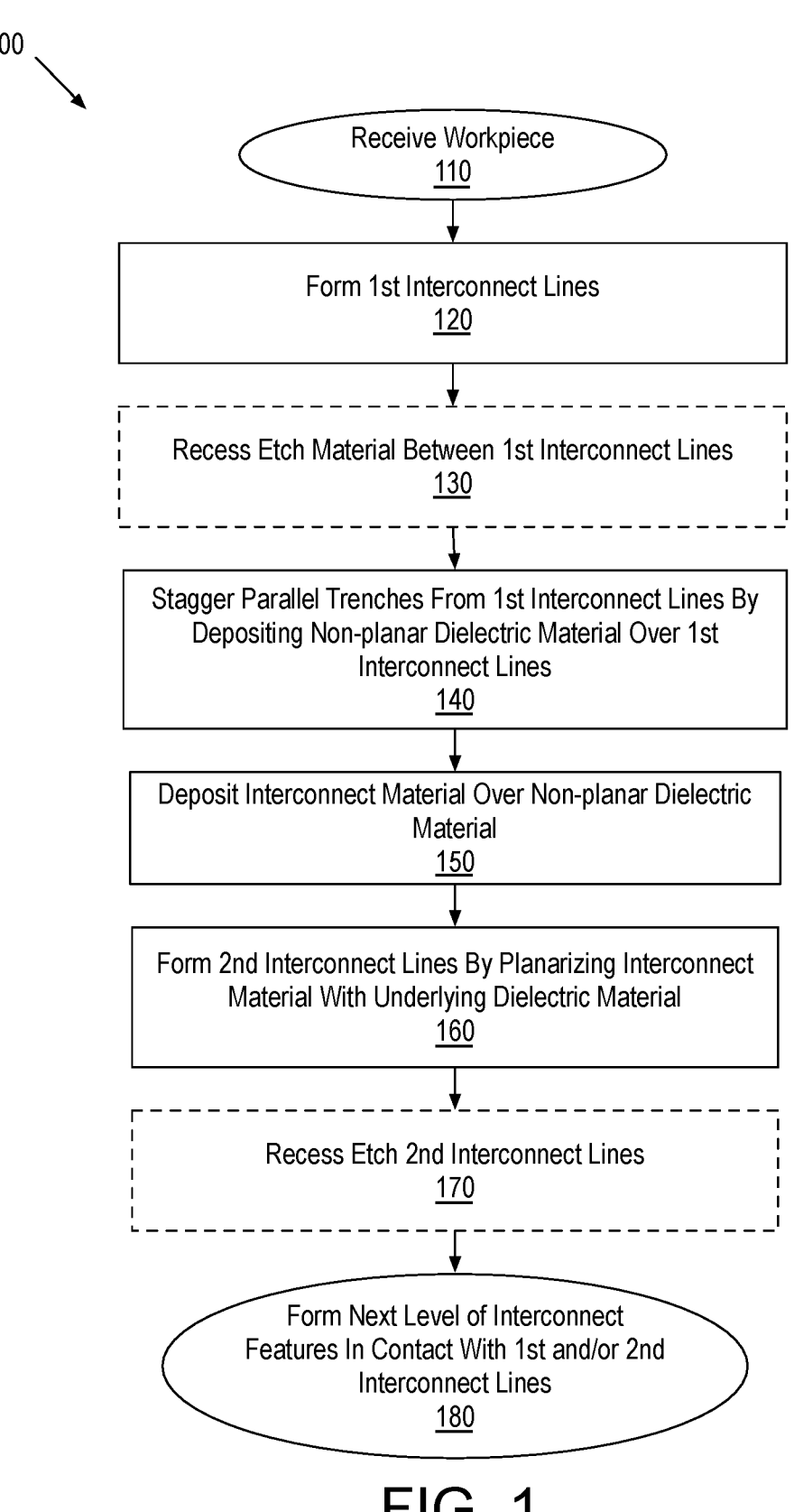
FIG. 1 is a flow diagram illustrating self-aligned methods of fabricating an IC having self-aligned staggered interconnect features, in accordance with some embodiments.

Embodiments are described with reference to the enclosed figures. While specific configurations and arrangements are depicted and discussed in detail, this is for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring the embodiments. Reference throughout this specification to "an embodiment" or "one embodiment" or "some embodiments" means that a particular feature, structure, function, or characteristic described in connection with the embodiment is included in at least one embodiment. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

The term "adjacent" here generally refers to a position of a thing being next to (e.g., immediately next to or close to with one or more things between them) or adjoining another thing (e.g., abutting it).

As used in the description and the appended claims, the singular forms "a", "an" and "the" are intended to include the plural forms as well, unless the context clearly indicates otherwise. It will also be understood that the term "and/or" as used herein refers to and encompasses all possible combinations of one or more of the associated listed items.

The terms "coupled" and "connected," along with their derivatives, may be used herein to describe functional or structural relationships between components. These terms are not intended as synonyms for each other. Rather, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause-and-effect relationship).

The terms "over," "under," "between," and "on" as used herein refer to a relative position of one component or material with respect to other components or materials where such physical relationships are noteworthy. For example, in the context of materials, one material or layer over or under another may be directly in contact or may have one or more intervening materials or layers. Moreover, one material between two materials or layers may be directly in contact with the two materials/layers or may have one or more intervening materials/layers. In contrast, a first material or layer "on" a second material or layer is in direct contact with that second material/layer. Similar distinctions are to be made in the context of component assemblies.

The term "signal" may refer to at least one current signal, voltage signal, magnetic signal, or data/clock signal.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Unless otherwise specified in the specific context of use, the term "predominantly" means more than 50%, or more than half. For example, a composition that is predominantly a first constituent means more than half of the composition is the first constituent (e.g., >50 at. %). The term "primarily" means the most, or greatest, part. For example, a composition that is primarily a first constituent means the composition has more of the first constituent than any other constituent. A composition that is primarily first and second constituents means the composition has more of the first and second constituents than any other constituent. The term "substantially" means there is only incidental variation. For example, composition that is substantially a first constituent means the composition may further include <1% of any other constituent. A composition that is substantially first and second constituents means the composition may further include <1% of any constituent substituted for either the first or second constituent.

As used throughout this description, and in the claims, a list of items joined by the term "at least one of" or "one or more of" can mean any combination of the listed terms.

Unless otherwise specified in the explicit context of their use, the terms "substantially equal," "about equal" or "approximately equal" mean that there is no more than incidental variation between two things so described. In the art, such variation is typically no more than +/−10% of a predetermined target value.

Described below are examples of integrated circuit interconnect structures in which adjacent parallel interconnect lines are vertically offset and laterally staggered from each other in a self-aligned manner. The interconnect structures described herein are also referred to herein as "interdigitated" because a first subset of the structures is laterally offset from a second subset of the structures such that individual ones of the first subset of structures are between two adjacent ones of the second subset of structures, and vice versa. Notably, the interdigitation of the interconnect structures describe herein does not require the two subsets of structures to be completely co-planar, although they may be co-planar. Indeed, one advantage of the interconnect structures described herein is that capacitive coupling of adjacent interconnect structures may be modulated as a function of an extent of their vertical overlap (i.e., co-planarity), which may be controlled without incurring significant manufacturing complexity and/or cost.

In contrast to interconnect lines of two different interconnect levels, which typically have their longest lengths in substantially orthogonal directions, the interdigitated interconnect lines described herein have non-orthogonal longest lengths and may be substantially parallel to each other. As such, the interdigitated interconnect lines described herein are akin to interconnect lines of a single interconnect level. However, nearest ones of the interdigitated interconnect lines are separated from each other by an intervening dielectric material having topography associated with the step coverage of the dielectric material over an underlying first level or "deck" of the interconnect lines that are within a first horizontal plane. A second level, or deck, of the interconnect lines that are within a second horizontal plane occupy trenches defined by, or resulting from, the topography of the intervening dielectric material. As described further below, a planarization process may be employed to pattern the second level of the interconnect lines according to the topography of the dielectric material in a substantially self-aligned manner Complex multi-mask lithography, and concomitant misregistration error may therefore be avoided. Furthermore, interconnect line pitch may be halved by interdigitating line levels of a larger pitch.

According to embodiments herein, the physical distance between two adjacent lines of a given pitch may be increased by their vertical offset, and since two lines nearest to each other may be positioned within different planes over a substrate, electric field strength between them may be advantageously limited to fringing fields.

Intra-layer capacitance of interdigitated interconnect lines of one interconnect level may be controlled, for example, through the chemical composition of the intervening dielectric material as well as through the physical geometry of the topography generated by depositing the intervening dielectric material over, and between, first interconnect features (e.g., lines or traces). The depth of topographic trenches may then determine the physical parameters of second interconnect features (e.g., lines or traces) retained within the trenches. As described further below, during fabrication of an IC interconnect structure, the depth of a trench between adjacent first interconnect features may be controlled with an optional recess etch process. If desired, a vertical height of the second interconnect features within a trench may also be controlled with a second recess etch process. Through the practice of these recess etches, interdigitated ones of the first and second interconnect features may have more or less vertical overlap to manage (e.g., minimize) the interconnect energy delay product of a given IC device.

As further described below, the chemical composition of the first interconnect features may differ from that of the interdigitated second interconnect features. Such flexibility may advantageously bury first interconnect features that are predominantly Cu within a suitable diffusion barrier so that the second interconnect features can be free of barrier material, which is typically of a higher relative permittivity material. As another example, one deck of interconnect features may have a chemical composition suitable for subtractive patterning while the other deck of interconnect features may have a chemical composition best suited for damascene processing.

For an interconnect structure including first and second interdigitated interconnect features, short and tall interconnect via openings may be landed on first and second interconnect lines or traces. These "differential" via openings of differing depth may then be filled, for example with a single damascene process that defines a co-planar top surface for all via material over a level of staggered interconnect lines. These techniques may be repeated for each successive interconnect level in a back-end-of-line (BEOL) IC fabrication process to form any number of interconnect line levels required by a particular IC.

FIG. 1 is a flow diagram illustrating self-aligned methods 100 for fabricating an IC having self-aligned staggered interconnect features, in accordance with some embodiments. FIG. 2-9 illustrate cross-sectional isometric views of an IC interconnect structure evolving as operations in the methods 100 are practiced, in accordance with some exemplary embodiments. Methods 100 may be practiced to fabricate IC interconnect structures having features different than those illustrated. Similarly, the IC interconnect structures illustrated in FIG. 2-9 may also be fabricated through the practice of alternatives to methods 100.

Referring first to FIG. 1, methods 100 begin at input 110 where a workpiece is received. The workpiece may be any known to be suitable for IC fabrication, such as a large format (e.g., 300-450 mm) wafer. At block 120, a first layer of interconnect features is formed over a substrate material of the workpiece, for example including logic transistors electrically connected by the interconnect features. Block 120 may comprise one or more lithographic patterning processes. For example, a single or a double patterning process may be practiced at block 120 to define first interconnect lines of any suitable chemical composition and having any suitable lateral and vertical dimensions. In some embodiments, one or more damascene-type formation processes comprising metal planarization are performed at block 120 based on the lithographic patterning process(es). In alternative embodiments, one or more subtractive patterning process(es) are performed at block 120 based on the lithographic patterning process(es).

Figure 2:
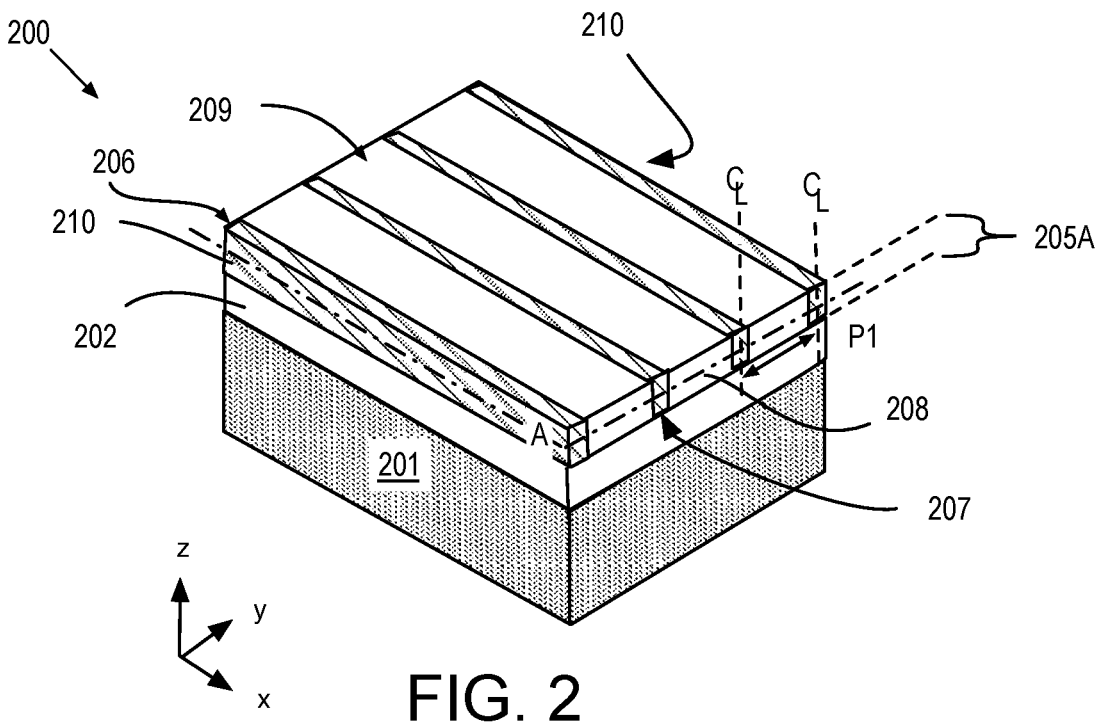
FIGS. 2, 3, 4, 5, 6, 7, 8 and 9 illustrate cross-sectional isometric views of an IC interconnect structure including self-aligned staggered interconnect lines evolving as operations in the methods depicted in FIG. 1 are practiced, in accordance with some exemplary embodiments.

FIG. 2 further illustrates an exemplary IC structure portion 200 including first interconnect lines 207 over substrate materials 201 and 202. In some embodiments, substrate material 201 is substantially (mono) crystalline Substrate material 201 may, for example, include one or more Group IV semiconductor material layers (e.g., Si, Ge, SiGe, GeSn, etc.), one or more Group III-V semiconductor material layers (e.g., InGaAs), one or more Group III-N semiconductor material layers (e.g., GaN), a combination of such semiconductor material layers, or other material (e.g., sapphire) known to be suitable as a workpiece substrate for IC device fabrication.

Substrate material 201 may include one or more device layers, each including one or more of semiconductor material layers, and may also have one or more interconnect levels comprising metallization features that electrically interconnect devices (e.g., transistors, DRAM memory cells, RRAM memory cells, MRAM memory cells, etc.) of the device layer(s). In some examples, substrate 201 includes MOSFETs (not depicted) in a region of a monocrystalline semiconductor device layer (e.g., silicon, Ge, SiGe, GeSn, etc.). Such FETs may be part of any application specific IC (ASIC) including one or more IP cores, for example. In some embodiments, circuitry within IC structure portion 200 comprises a microprocessor core, further including an arithmetic logic unit (ALU) and shift registers, for example. In other examples, circuitry within IC structure portion 200 comprises a wireless radio circuit or floating-point gate array (FPGA).

Substrate material 202 may include one or more dielectric material layers surrounding metallization features (not depicted) interconnecting devices with substrate material 201. The chemical composition of substrate material 202 may be any known to be suitable as an IC device interlayer dielectric (ILD). In some embodiments, substrate material 201 comprises oxygen and may further comprise silicon (e.g., $SiO_2$, $SiOC(H)$, SiON, etc.). Substrate material 202 may have any thickness (e.g., in z-dimension), as embodiments are not limited in this context. One or more conductive vias (not depicted) is one example of a metallization feature that may extend through substrate material 202, for example contact transistor terminals (not depicted) within substrate material 201.

Interconnect lines 207 are all within an interconnect line level or "deck" 205A. As shown, interconnect line level 205A comprises interconnect lines 207 embedded within a dielectric (insulator) material 208. Interconnect line level 205A is associated with an x-y plane A that is substantially parallel to an x-y plane of substrate 201 and passes through interconnect lines 207. In the illustrated example, within interconnect line level 205A, interconnect lines 207 are substantially coplanar within plane A. However, co-planarity may not be as ideal as illustrated because of inherent variability in IC device manufacturing. Within interconnect line level 205A, interconnect lines 207 are substantially parallel to each other, and have a pitch P1 between center-lines of two adjacent interconnect lines 207. Interconnect line pitch P1 may be the smallest pitch possible for the patterning technique employed. In some examples, pitch P1 is less than 50 nm. Although pitch P1 is fixed across all interconnect lines 207 illustrated in FIG. 2, pitch P1 may also vary within interconnect line level 205A.

Interconnect lines 207 may comprise one or more of any conductive materials known to be suitable for IC interconnect lines. In the illustrated embodiments, each of interconnect lines 207 comprises a fill material 210. In some exemplary embodiments fill material 210 is a metal, with one example being a metal of predominantly Cu. In other embodiments, fill material 210 is predominantly W. In other embodiments, fill material 210 is predominantly Ru, Co, or Mo. Interconnect lines 207 may be patterned according to subtractive or damascene techniques, with the latter being more suitable for embodiments where the chemical composition of fill material 210 is not amenable to definition through etching processes. FIG. 2 illustrates a damascene embodiment, for example where fill material 210 is predominantly Cu and a planarization process retains fill material 210 only within trenches extending through dielectric material 208 with their longest length in a first direction (e.g., along x-dimension). In the example shown, interconnect lines 207 have a top surface 206 that is substantially planar with a top surface 209 of dielectric material 208. Although interconnect lines 207 are illustrated with a substantially vertical sidewall (e.g., along z-dimension), patterning through damascene processing generally leads to a negative line sidewall slope so that interconnect line top surface 206 has a larger transverse width (e.g., y-dimension) than the transverse width at a bottom of interconnect lines 207 (i.e., at interface with substrate material 202). In contrast, subtractive patterning of interconnect lines would instead lead to a positive line sidewall slope so that interconnect line top surface 206 has a smaller transverse width than the transverse width at the bottom of interconnect lines 207. Accordingly, the reference to "damascene" interconnect lines or "subtractively-patterned" interconnect lines implies a structural aspect rather than merely a fabrication technique.

Dielectric material 208 may have any composition(s) suitable for electrical isolation of IC interconnect lines 207. Dielectric material 208 may have a different composition than substrate material layer 202, or dielectric material 208 may have substantially the same composition as substrate material layer 202. Dielectric material 208 within interconnect line level 205A may of a substantially homogeneous composition. In some examples, dielectric material 208 is a low-k dielectric material (e.g., SiOCH) having a relative permittivity (or dielectric constant) below 3.5. In other examples, dielectric material 208 may be any of SiO, SiON, hydrogen silsesquioxane, methyl silsesquioxane, polyimide, polynorbornenes, benzocyclobutene, or the like. Dielectric material 208 may also comprise multiple layers of dielectric material, for example including two or more of the materials listed above.

Returning to FIG. 1, methods 100 continue at block 130, which is illustrated in dashed line to emphasize that the practice of block 130 is optional. At block 130, material between the first interconnect lines is recessed with an etch process suitable for the material. The recess etch is performed to generate some non-zero amount of topography between the first interconnect lines. Hence, a recess etch at block 130 may be useful where interconnect lines have been patterned with a planarization process as part of a damascene technique and there is only insignificant topography following the planarization process. However, block 130 may also be practiced for embodiments where interconnect lines were subtractively patterned and there is significant topography prior to the optional recess etch. If practiced, the recess etch is advantageously selective to the material between interconnect lines and the interconnect lines survive the recess etch.

Figure 3:
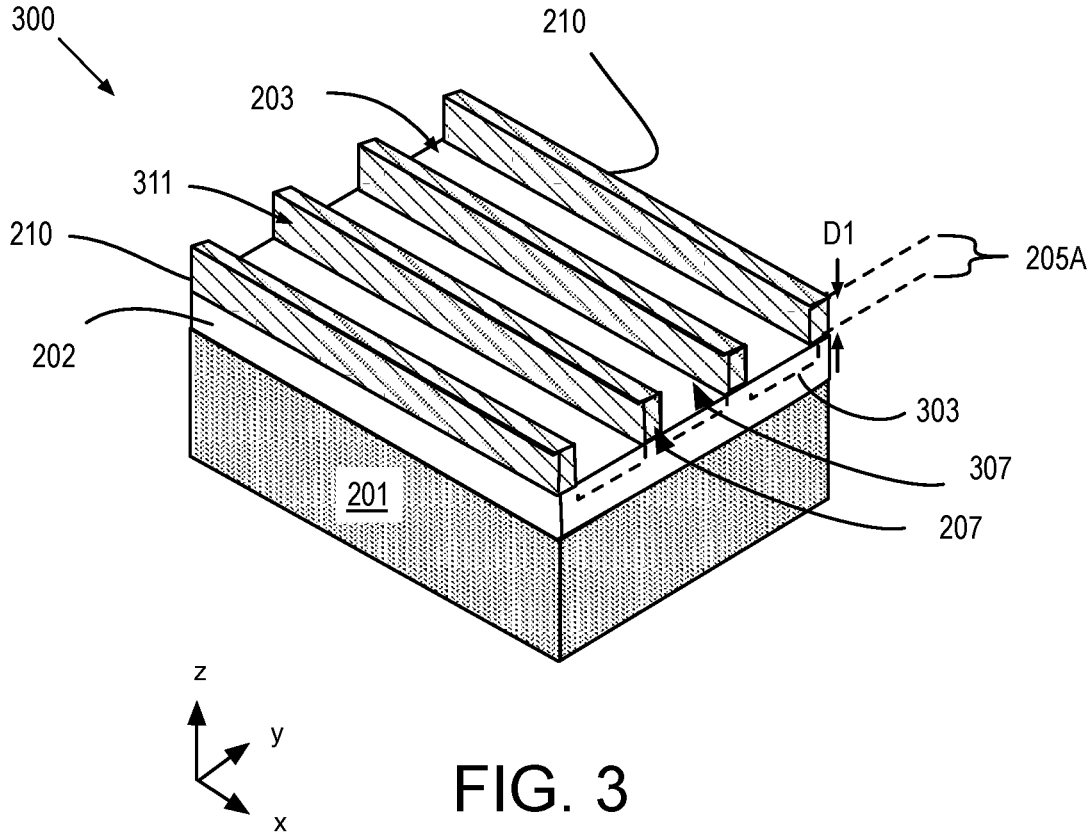

In the example further illustrated in FIG. 3, dielectric material 208 has been recess etched from interconnect structure portion 200 to form interconnect structure portion 300, which includes open spaces 307 between adjacent interconnect lines 207. The planarization of interconnect structure portion 200 (FIG. 2), for example resulting from a damascene metallization process, is altered by recess etching at least a partial thickness of dielectric material 208. In IC structure portion 300, substantially all dielectric material 208 has been removed by a recess etch process that is selective to the chemical composition of dielectric material 208 over that of interconnect line fill material 210. With dielectric material 208 removed to a recess depth D1, interconnect line sidewall 311 is fully exposed.

Interconnect structure portion 300 is also representative of alternative embodiments where interconnect lines 207 are instead subtractively patterned. Accordingly, such embodiments need not include any recess etch to arrive at the illustrated topography attributable to the vertical height of interconnect lines 207 (D1). However, an optional recess etch of material between adjacent interconnect lines 207 may further remove substrate material 202 below interconnect line level 205A. For example, in FIG. 2, a top surface 203 of substrate material 202 may be recessed to any desired depth so that space 307 extends below interconnect line level 205A, for example recessing a portion of substrate material 202, as represented by dashed line 303.

Returning to FIG. 1, methods 100 continue at block 140 where one or more dielectric material layers are deposited over the topography of the first interconnect lines. Because of the underlying topography, the dielectric material layer(s) undulates between trenches laterally staggered from the first interconnect lines, and ridges directly over the first interconnect lines. The dielectric material layers may be deposited with any deposition process that retains at least some of the underlying topography. Advantageously, the dielectric deposition process may even amplify the underlying topography. In exemplary embodiments, block 140 comprises a chemical vapor deposition (CVD) or plasma enhanced (PE) CVD process. Atomic layer deposition (ALD) processes are also possible although deposition rates may be significantly lower than for CVD and PECVD embodiments. In some embodiments, the deposition process is advantageously non-conformal, for example depositing dielectric material on sidewalls of the underlying interconnect lines at a rate lower than the rate at which the dielectric material accumulates over top surfaces of the underlying interconnect lines. Optionally, a dep-etch process may be employed to combat key-holing and/or bread-loafing of the dielectric material(s) so that trenches between the ridges remain open.

Figure 4:
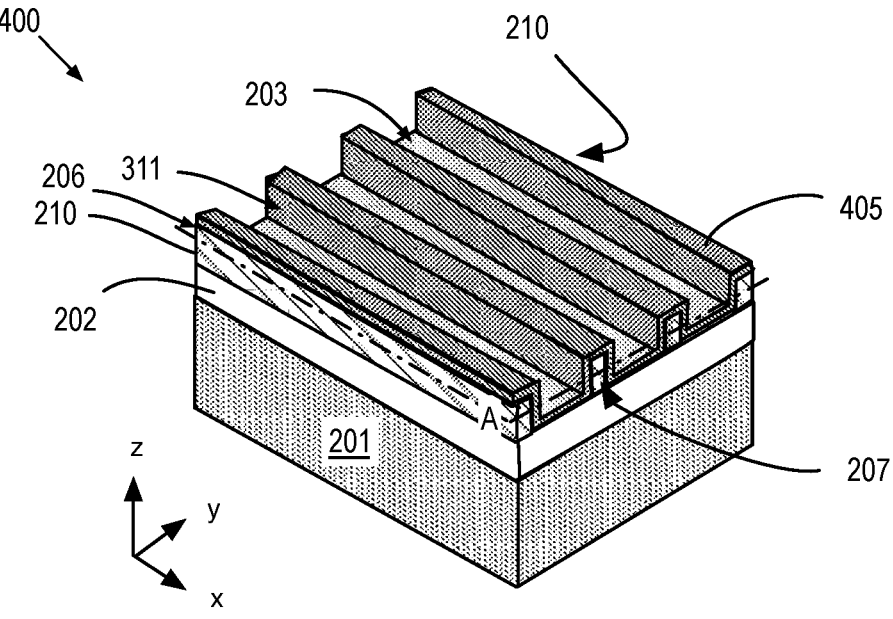

In the exemplary IC structure portion 400 illustrated in FIG. 4, a first dielectric material layer 405 has been deposited upon IC structure portion 300. Dielectric material layer 405 may, for example, function as a diffusion barrier for embodiments where interconnect lines 207 comprise a material (e.g., Cu) subject to outmigration. In some embodiments, dielectric material layer 405 comprises nitrogen and may further comprise at least one of silicon, a metal or oxygen. Dielectric material layer 405 may be deposited to any thickness suitable for a diffusion barrier with 3-5 nm being one exemplary thickness range. A conformal deposition process (e.g., CVD) may ensure dielectric material layer 405 has nearly the same thickness on interconnect line sidewall 311 as interconnect line top surface 206.

Figure 5:
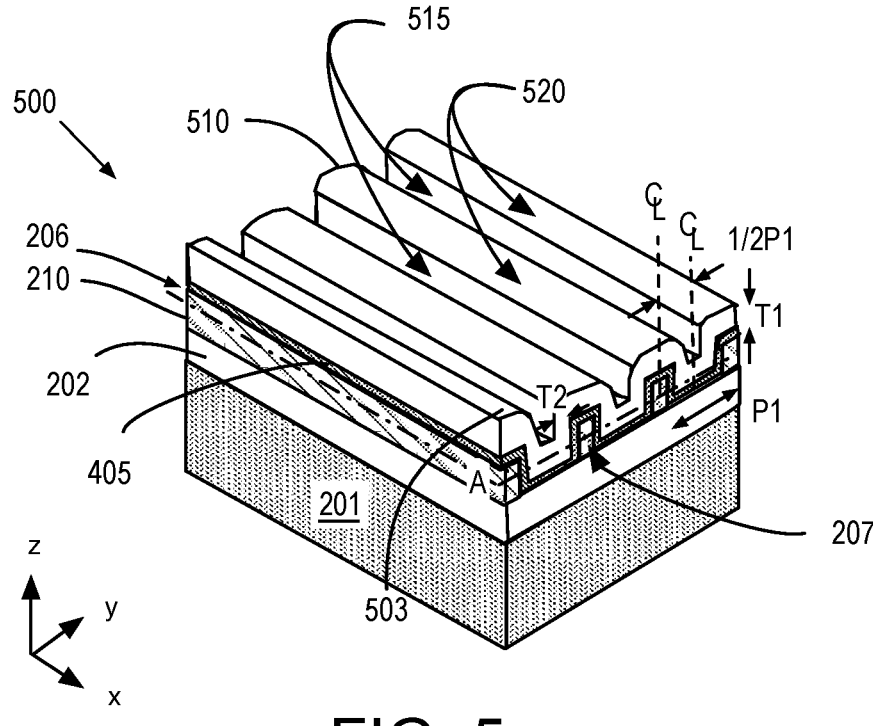
Figure 6:
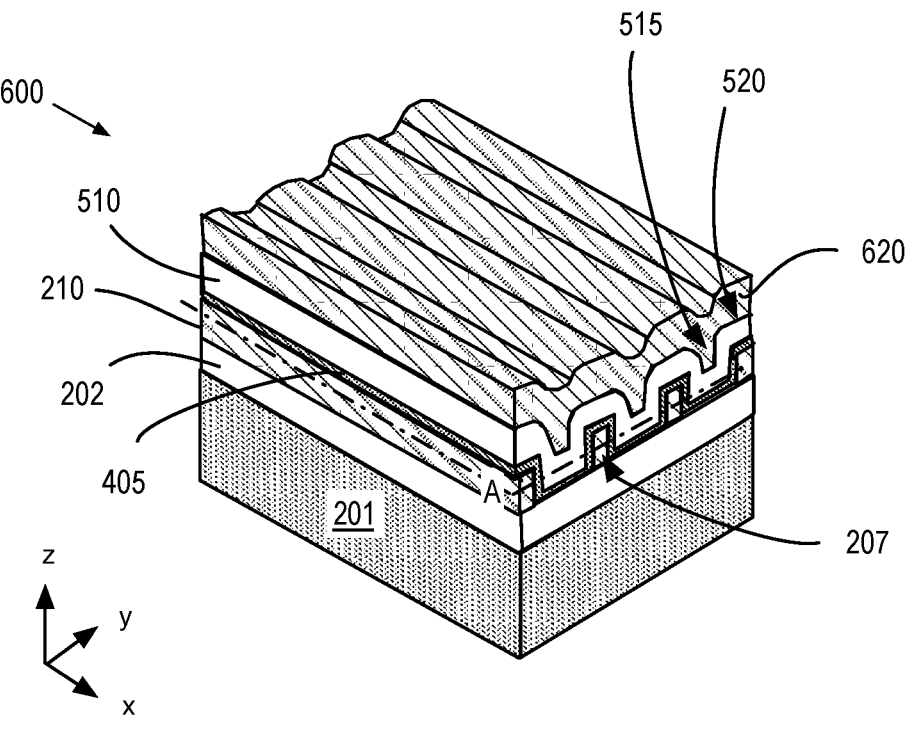

FIG. 5 further illustrates an exemplary IC structure portion 500 after another dielectric material layer 510 has been deposited on IC structure portion 400. For embodiments lacking dielectric material layer 405, dielectric material layer 510 may be in direct contact with interconnect lines 207. In advantageous embodiments, the chemical composition of dielectric material layer 510 is different from that of dielectric material layer 405. For example, dielectric material layer 510 may have a lower relative permittivity than dielectric material layer 405, and may be a low-k (e.g., <3.5) composition. Dielectric material layer 510 may comprise less nitrogen than dielectric material layer 405. Dielectric material layer 510 may be of a substantially homogeneous composition, for example, being a single low-k dielectric material (e.g., SiOCH) having a relative permittivity below 3.5. In other examples, dielectric material layer 510 may be any of SiO, SiON, hydrogen silsesquioxane, methyl silsesquioxane, polyimide, polynorbornenes, benzocyclobutene, or the like.

Dielectric material layer 510 is deposited to a thickness T1 over interconnect line top surface 206. Thickness T1 may be predetermined to ensure dielectric material ridges 520 reach an adequate height while dielectric trenches 515 remain open (not key-holed) with some non-zero transverse (e.g., y-dimension) width. Dielectric material layer 510 within a bottom of dielectric trenches 515 may be substantially thickness T1. For embodiments where dielectric material layer 510 is of a substantially conformal thickness, thickness T1 may be limited to less than half of pitch P1. In advantageous embodiments where dielectric material layer 510 is non-conformal (e.g., super-conformal), thickness T1 may be significantly more than half of pitch P1. In some examples, thickness T1 is at least 1.5-2 times the sidewall thickness T2, as measured substantially normal from interconnect line sidewall 311. Because dielectric material trenches 515 are centered between two adjacent interconnect lines 207, the centerlines of dielectric material trenches 515 are staggered from the centerlines of interconnect lines 207 by approximately one-half of interconnect line pitch P1.

Although two dielectric material layers 405 and 510 are illustrated in FIG. 5, one or more additional dielectric material layers (not depicted) may be deposited over a top surface 503 of dielectric material layer 510. In one example, another instance of dielectric material layer 405 may be deposited over dielectric material layer 510 for embodiments where it is advantageous to line dielectric material trenches 515 with a diffusion barrier. In another example, where no diffusion barrier is needed over interconnect lines 207, the dielectric material stack illustrated in FIG. 5 may be reversed with dielectric material layer 405 being over dielectric material 510 to provide a diffusion barrier within dielectric material trenches 515 rather that in contact with interconnect lines 207.

Returning to FIG. 1, methods 100 continue at block 150 where an interconnect material is deposited over the nonplanar dielectric material(s). Hence, rather than remove the topography retained or amplified by the dielectric material (s) deposited at block 140 (e.g., with a planarization process), the interconnect material is deposited within the dielectric trenches that were formed "self-alignedly" as a natural consequence of the topography of the underlying interconnect lines. Any metallization process may be practiced at block 150, for example to deposit electrically conductive material of any composition suitable for interconnect lines.

In some embodiments, a sputter deposition process and/or an electrolytic or electroless plating process is practiced at block 150. One or more metal may also be deposited by ALD. In some examples, multiple deposition processes are practiced at block 150, for example sputter-deposition of a seed layer may precede electrolytic plating of a fill metal. In the example illustrated in FIG. 6, exemplary IC structure portion 600 further includes a metallization layer 620, which substantially fills dielectric material trenches 515. Metallization layer 620 also includes overburden that is over dielectric material ridges 520.

Metallization layer 620 may comprise one or more of any conductive materials known to be suitable for IC interconnect lines. In some embodiments metallization layer 620 has a different composition than interconnect lines 207. In other embodiments, metallization layer 620 has substantially the same composition as interconnect lines 207. In one example metallization layer 620 is a metal of predominantly Cu. In other embodiments, metallization layer 620 is predominantly W, Ru, Co, or Mo, for example.

Returning to FIG. 1, methods 100 continue at block 160 where interdigitated interconnect lines are formed by planarizing the interconnect metallization deposited at block 150 with the underlying dielectric material. The topography in the underlying dielectric material is leveraged to define the second interconnect lines such that the second interconnect lines are confined to the dielectric material trenches. No lithographic patterning is employed to define the second interconnect lines. Accordingly, the second interconnect lines are referred to herein as "self-aligned." Notably, the planarization process practiced at block 160 may be performed regardless of whether the interconnect metallization composition is amendable to subtractive patterning. Hence, the planarization process practiced at block 160 is for the sake of forming self-aligned interconnect lines rather than to accommodate a particular metallization that would otherwise be difficult to pattern.

Figure 7:
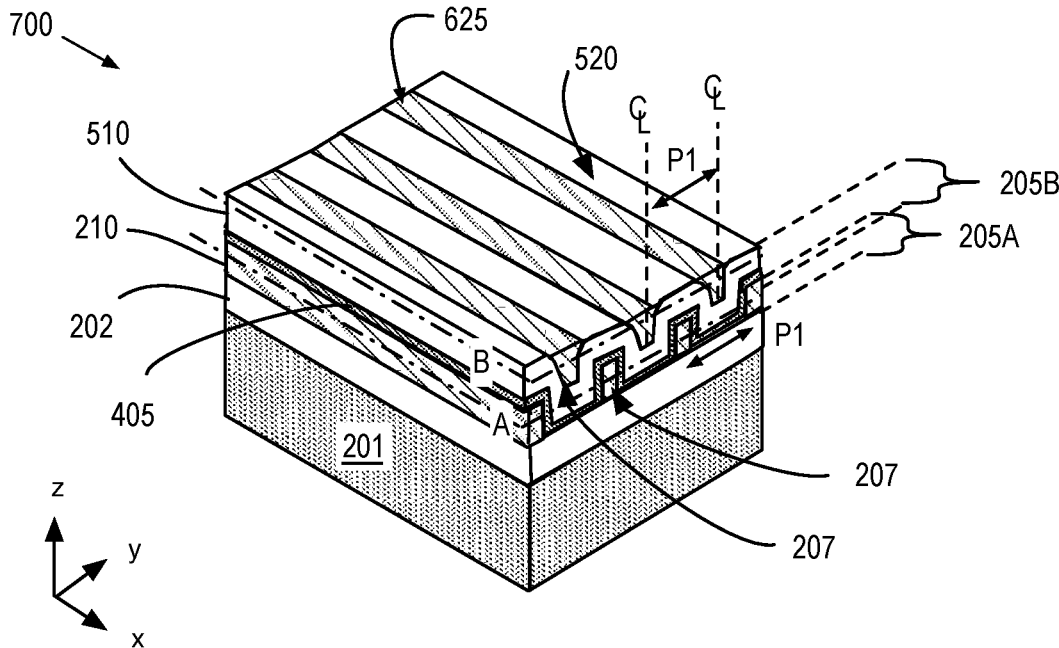

FIG. 7 illustrates exemplary IC structure portion 700 following a (single) damascene planarization that forms additional interconnect lines 207 within an interconnect line level 205B. Interconnect lines 207 have a top surface 625 that is substantially co-planar with a top surface of dielectric material layer 510. Interconnect line level 205B is associated with an x-y plane B that is substantially parallel to an x-y plane A and passes through the upper deck of interconnect lines 207. For the illustrated example, plane B does not pass through any interconnect lines 207 of plane A, and vice versa.

In the illustrated example, within interconnect line level 205B, interconnect lines 207 are substantially coplanar. However, co-planarity may not be as ideal as illustrated because of inherent variability in IC device manufacturing. Within interconnect line level 205B, interconnect lines 207 are substantially parallel to each other with their longest lengths in the first direction (e.g., along x-dimension), as dictated by the topography of the underlying features. Because interconnect metallization is retained only within dielectric trenches, both levels of interconnect lines 207 have the line pitch P1. Notably, interconnect lines 207 of interconnect line level 205A are parallel to interconnect lines 207 of interconnect line level 205B, but are laterally offset, or staggered, in at least one dimension (e.g., y-axis). In the illustrated example, interconnect lines 207 of interconnect line level 205A are staggered by approximately one-half of line pitch P1 so that within line pitch P1 there are two interconnect lines 207, one within interconnect line level 205A and another within interconnect line level 205B. Hence, while the interconnect line pitch P1 may be the smallest pitch possible for a given patterning technique employed, interconnect line levels 205A and 205B halve the effective interconnect line pitch of the interdigitated interconnect lines 207. For embodiments where line pitch P1 is less than 50 nm (e.g., 40 nm), the half pitch is less than 25 nm (e.g., 20 nm).

Within interconnect line level 205B, interconnect lines 207 may comprise one or more of any conductive materials known to be suitable for IC interconnect lines. In some embodiments, each of interconnect lines 207 comprises a fill material, with one example being a metal of predominantly Cu. In other embodiments, within interconnect line level 205B, interconnect lines 207 are predominantly W, Ru, Co, or Mo, for example. In some embodiments, interconnect lines 207 of interconnect line levels 205A and 205B have substantially the same composition (i.e., same fill material). However, interconnect line levels 205A and 205B may also have lines of different chemical compositions. For example, fill material 210 of interconnect line level 205A may have a first of any of the above exemplary compositions, while fill material of interconnect line level 205B may have a second of any of the above exemplary compositions.

Noting that interconnect lines 207 within line level 205A may be subtractively patterned to have a first line sidewall slope or damascene patterned to have a second line sidewall slope, interconnect lines 207 within line level 205B may also have a line sidewall slope indicative of their self-aligned nature. For example, in the example shown in FIG. 7, the x-sectional profile (e.g., within y-z plane) of interconnect lines within line level 205B is flared to a larger transverse width (e.g., y-dimension) at line top surface 625. The illustrated flared profile is associated with the undulating topography of dielectric material layer 510 (which smooths out underlying topography of interconnect lines within line level 205A), and a planarization process that stops on dielectric material ridges 520.

Returning to FIG. 1, methods 100 may continue with an optional recess etching of the second interconnect lines at block 170 (outlined in dashed line as optional). Hence, once the second interconnect lines are defined through a planarization process, one or more etch processes may be performed at block 170 to recess the top surface of the second interconnect lines. Although such a recess etch may be performed without any mask, in some embodiments a mask may be first lithographically patterned so as to protect some of the second interconnect lines from the recess etch process while other lines are exposed to the etch process. Such a selective interconnect line etch back process may differentiate the second interconnect lines into interconnect lines of two or more types. In further embodiments, a masked recess etch may be practiced to completely remove some subset of the second interconnect lines, or portions thereof.

Following block 170 (or if block 170 is not practiced), methods 100 complete at output 180 where a next level of interconnect features are formed in direct contact with the interconnect lines formed at block 120 and/or 160. Such interconnect features may be interconnect vias, for example, that extend vertically through one or more dielectric materials. Because there are two decks of interdigitated interconnect lines, in some advantageous embodiments, vias with depth differentials are formed to contact the laterally staggered interconnect lines.

Figure 8:
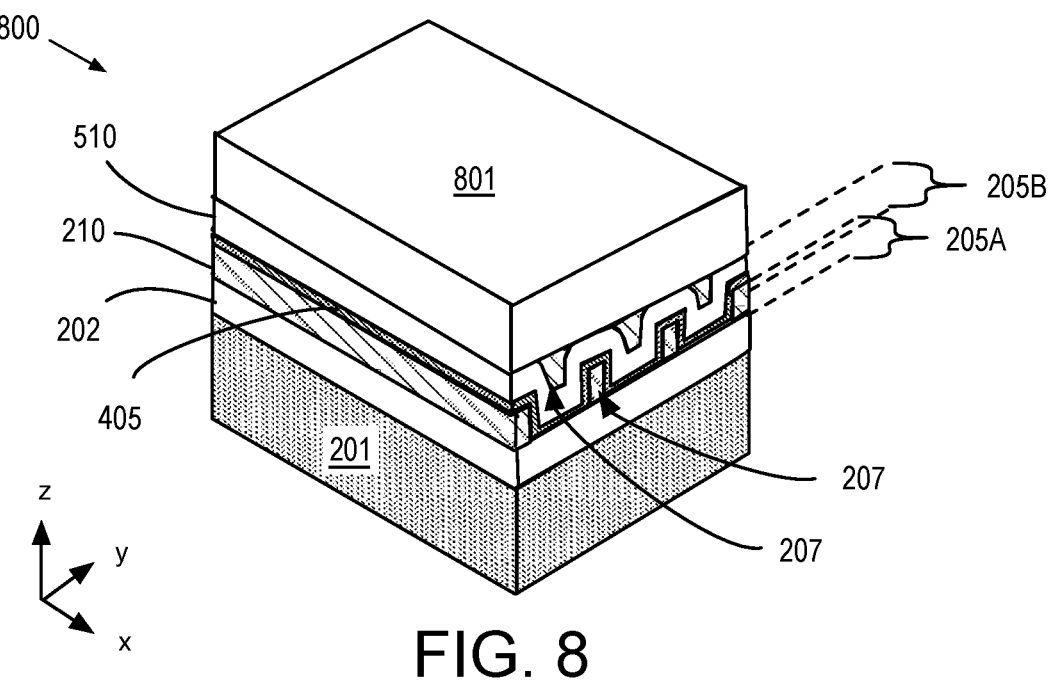

In the exemplary IC interconnect structure portion 800 illustrated in FIG. 8, a dielectric material 801 has been deposited over interconnect line levels 205A and 205B. Dielectric material 801 is a substantially planar slab may each have any composition(s) suitable for electrical isolation of IC interconnect features. The composition of dielectric material 801 may be the same as, or different than, one or more of substrate material 202, dielectric material layer 405, or dielectric material 510. Dielectric material 801 may be layered or of a substantially homogeneous composition. In some examples, dielectric material 801 is a low-k dielectric material (e.g., SiOCH) or any of SiO, SiON, hydrogen silsesquioxane, methyl silsesquioxane, polyimide, polynorbornenes, benzocyclobutene, or the like.

Figure 9:
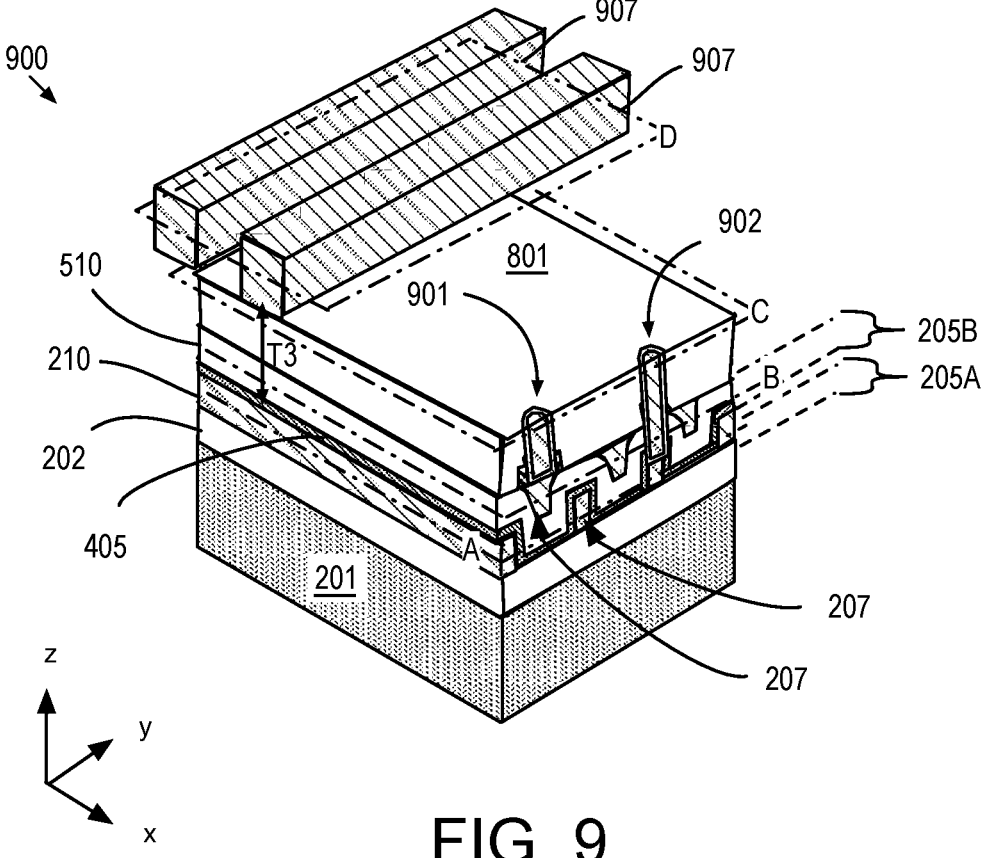

FIG. 9 further illustrates processing of IC structure 800 into exemplary IC structure portion 900, which further includes a shallow via 901 and a deep via 902. Shallow via 901 extends through dielectric material 801 to contact interconnect lines 207 within interconnect line level 205B. Deep via 901 extends through dielectric material 801, as well as dielectric material layers 510 and 405, to contact interconnect lines 207 within interconnect lines level 205A. For a thorough discussion of some exemplary techniques of forming shallow/deep vias 901/902, the interested reader is referred to U.S. patent application Ser. No. 17/560,085, which is under common ownership and/or obligation of common assignment, and is incorporated herein by reference, in its entirety for all purposes.

In the example illustrated, shallow via 901 and deep via 902 are coplanar within a plane C that is over interconnect lines 207 of both interconnect lines levels 205A and 205B. Hence, vias 901 and 902 may have a coplanar upper surface, but intersect interconnect lines within different planes (e.g., planes A and B) at different depths.

As further illustrated in FIG. 9, IC structure portion 900 further includes one or more additional levels of interconnect lines 907 that are co-planar within an overlying x-y plane D. The dielectric material thickness T3 between interconnect plane D and plane A is significantly larger than the dielectric material thickness T1 between plane B and plane A. Interconnect lines 907 have a longest length extending in a second direction (e.g., y-dimension), orthogonal to the first direction. Although only one level of interconnect lines 907 is illustrated, methods 100 may be iterated a second time to fabricate interdigitated interconnect lines substantially as described above for interconnect lines 207, but instead extending in the second direction.

Figure 10:
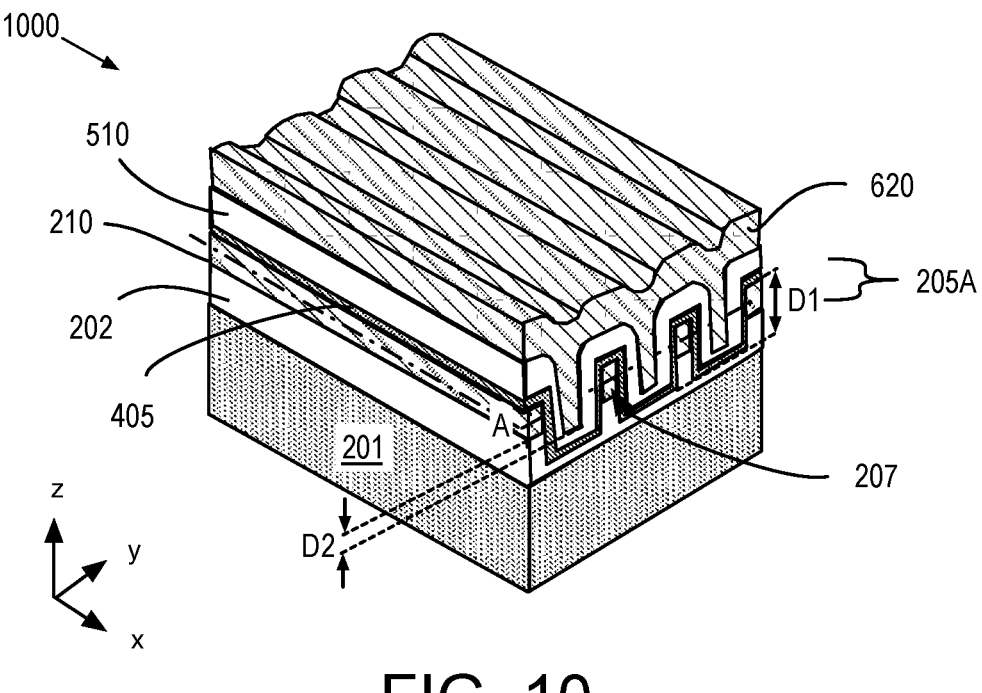
FIGS. 10, 11A, 11B and 11C illustrate cross-sectional isometric views of an IC interconnect structure having self-aligned staggered interconnect lines, in accordance with some alternative embodiments.
Figure 11A:
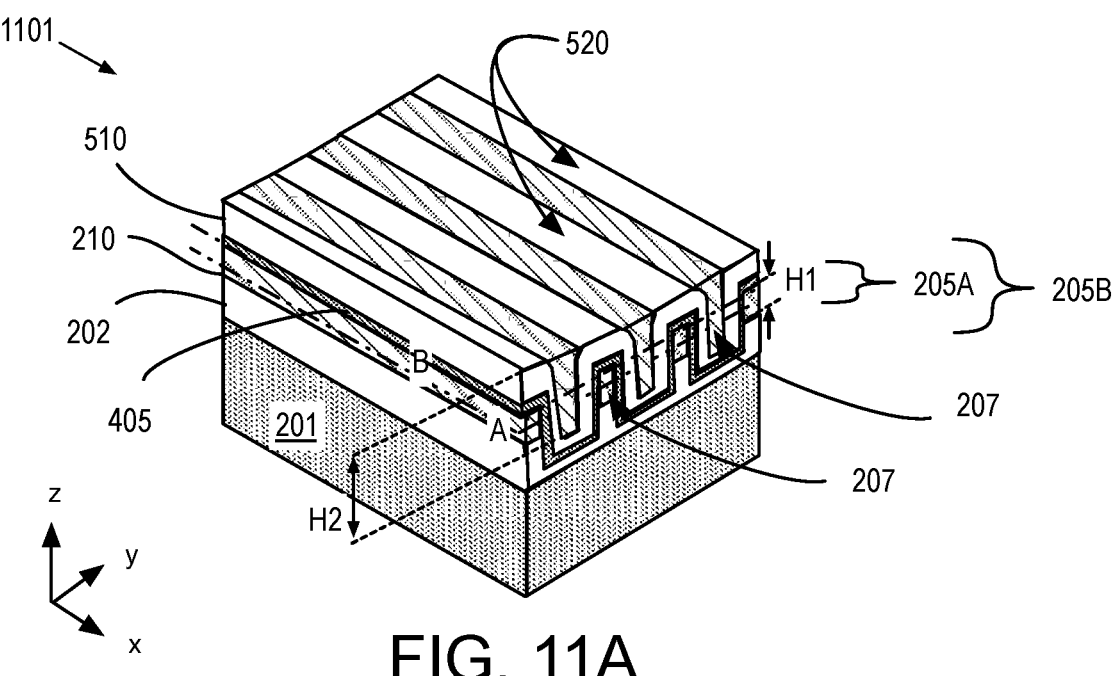
Figure 11B:
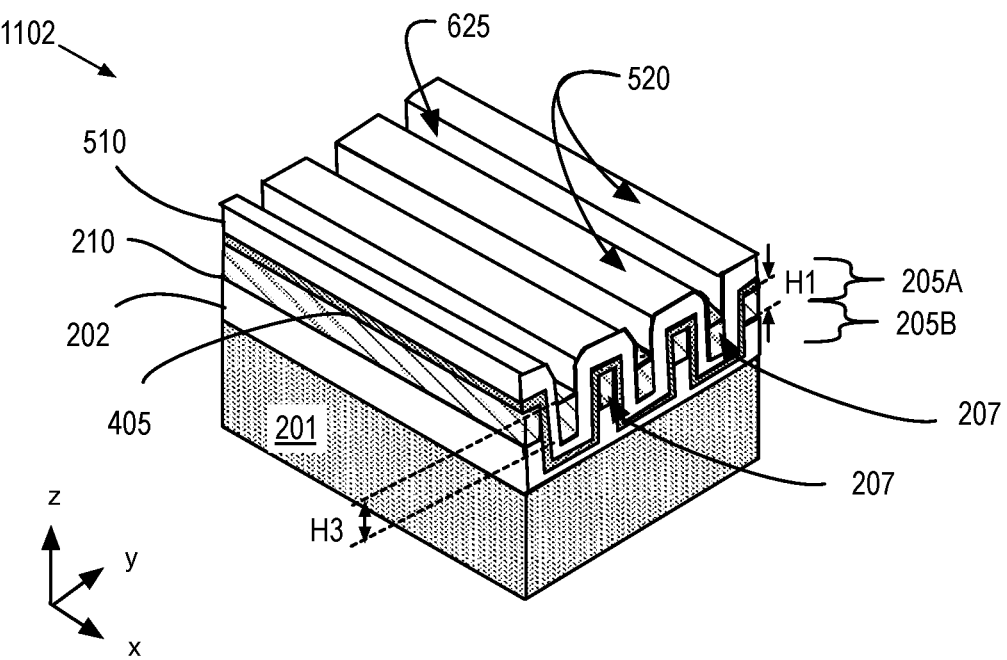

FIGS. 10, 11A and 11B illustrate cross-sectional isometric views of IC structure portions having interdigitated interconnect lines in accordance with some alternative embodiments where the optional recess etches are practiced as part of methods 100 (FIG. 1).

FIG. 10 depicts an exemplary IC structure portion 1000 that further illustrates how a recess etch, for example performed at block 130 (FIG. 1) of methods 100, may extend the depth of interconnect lines within interconnect line level 205B. As shown, recess depth D1 places a bottom of interconnect metallization 620 a depth D2 below a bottom of interconnect lines 207 of interconnect line level 205A. Hence, the deeper recess depth into substrate material 202 will increase a vertical overlap of interdigitated interconnect lines 207. This deeper recess depth may improve conductivity of the interconnect lines within line level 205A and may also impact capacitance between interconnect lines of both line levels 205A and 205B. The recess depth may therefore be considered a tuning parameter useful to achieve a given power delay product suitable for a given interconnect level of a particular IC device.

FIG. 11A further illustrates an IC structure portion 1101 resulting from IC structure portion 1000 when further processed substantially as described above for IC structure portion 700. With the greater recess depth into substrate material 201, interconnect line level 205B includes interconnect lines 207 of a height H2 that is greater than the height H1 of the interconnect lines 207 within line level 205A. Accordingly, interconnect line level 205B may be within a plane B that is either above, substantially coincident with, or below, a plane A passing through interconnect line level 205A.

FIG. 11B further illustrates an IC structure portion 1102 resulting from IC structure portion 1100 when further processed through a recess etch, for example performed at block 170 (FIG. 1) of methods 100. As shown in FIG. 11B, interconnect line top surface 625 that was substantially coplanar with a top surface of dielectric material ridges 520 following a planarization process has been recess etched, for example with any dry or wet chemical etch process known to be suitable for the composition. Accordingly, interconnect lines 207 of interconnect line level 205B have a height H3 that is less than their planarized heights (e.g., H2 in FIG. 11A). Height H3 may be substantially equal to height H1. Height H3 may also be smaller than height H1.

Figure 11C:
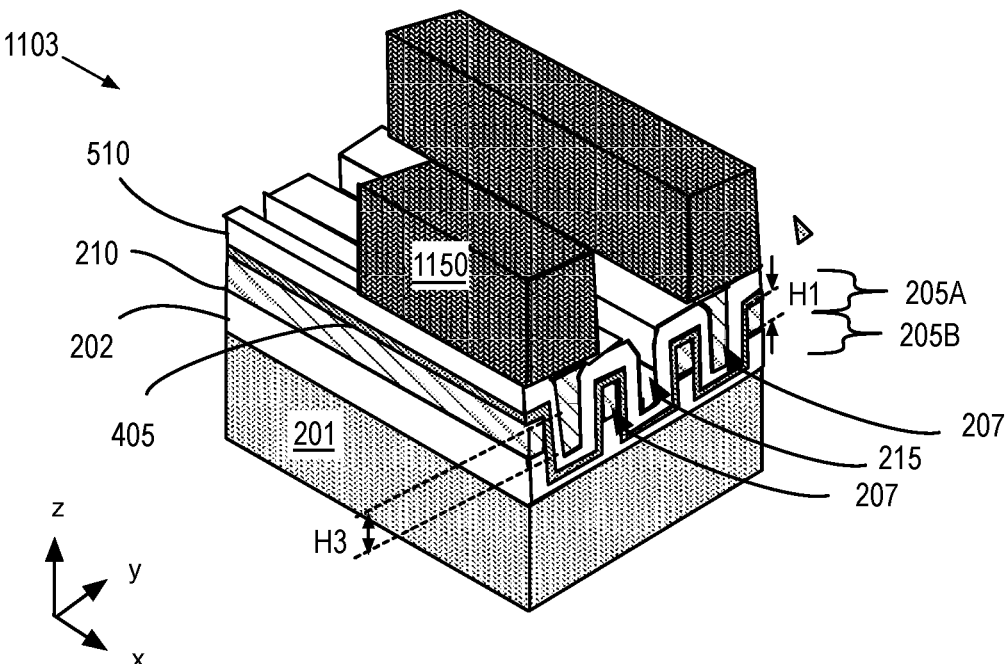

FIG. 11C further illustrates an IC structure portion 1103 resulting from IC structure portion 1100 when further processed through a masked recess etch, for example performed at block 170 (FIG. 1) of methods 100. In this example, a mask 1150 has been patterned to protect some portion of the interconnect lines 207 of line level 205B. FIG. 11C illustrates the recessed line height H3 being null for an example where the recess etch completely removes one or more of the unmasked interconnect lines 207 (or portions thereof) from interconnect line level 205B. Hence, although the second deck of interconnect lines are completely self-aligned, some of those lines may be ultimately deleted, or trimmed, from an interconnect structure for greater circuitry routing/layout flexibility.

Any of the IC structure portions described above may be implemented in any integrated circuit of any IC die. Such an IC die may include logic and/or memory, for example. The IC die may include both logic and memory, for example where a logic circuit, such as a processor further includes embedded DRAM (eDRAM). Any of the IC structure portions described above may be implemented within one or more interconnect levels. For example, for an IC die including eDRAM, the IC structure portions described above may be implemented only within logic circuitry, only within memory array circuitry, or within both logic circuitry and memory array circuitry.

Figure 12:
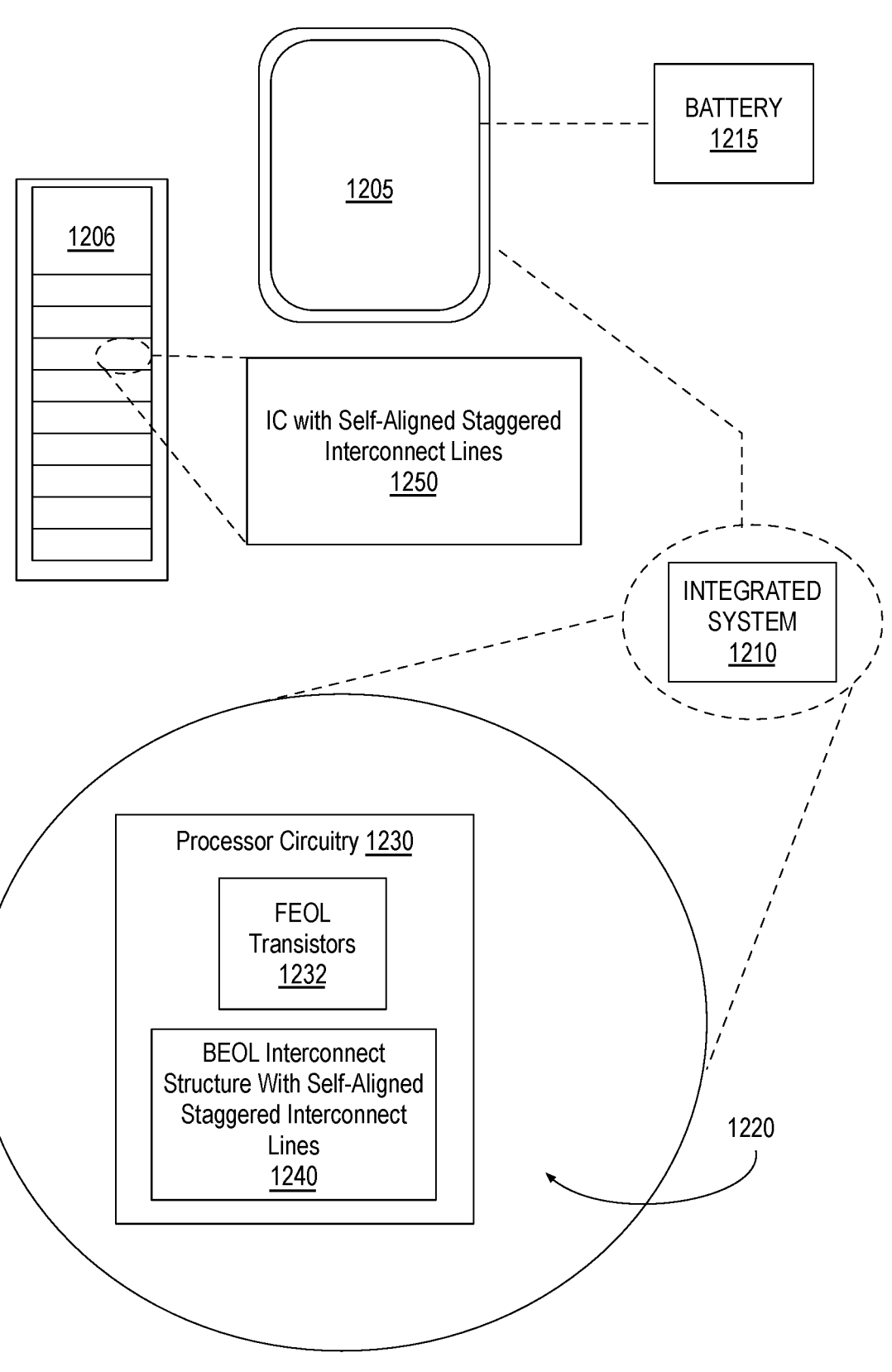
FIG. 12 illustrates a mobile computing platform and a data server machine employing an IC with embedded memory including self-aligned staggered interconnect lines, in accordance with some embodiments.

FIG. 12 illustrates a mobile computing platform 1205 and a data server computing platform 1206 employing an IC including self-aligned staggered interconnect lines, for example as described elsewhere herein. The server platform 1206 may be any commercial server, for example including any number of high-performance computing platforms disposed within a rack and networked together for electronic data processing, which in the exemplary embodiment includes a microprocessor 1250 including self-aligned staggered interconnect lines, for example as described elsewhere herein.

The mobile computing platform 1205 may be any portable device configured for each of electronic data display, electronic data processing, wireless electronic data transmission, or the like. For example, the mobile computing platform 1205 may be any of a tablet, a smart phone, laptop computer, etc., and may include a display screen (e.g., a capacitive, inductive, resistive, or optical touchscreen), a chip-level or package-level integrated system 1210, and a battery 1215. At least one IC of chip-level or package-level integrated system 1210 includes self-aligned staggered interconnect lines, for example as described elsewhere herein. In the example shown in expanded view 1220, integrated system 1210 includes microprocessor circuitry 1230 including FEOL transistors 1232 and BEOL interconnect structures 1240. In exemplary embodiments interconnect structures 1240 include self-aligned staggered interconnect lines, for example as described elsewhere herein.

Figure 13:
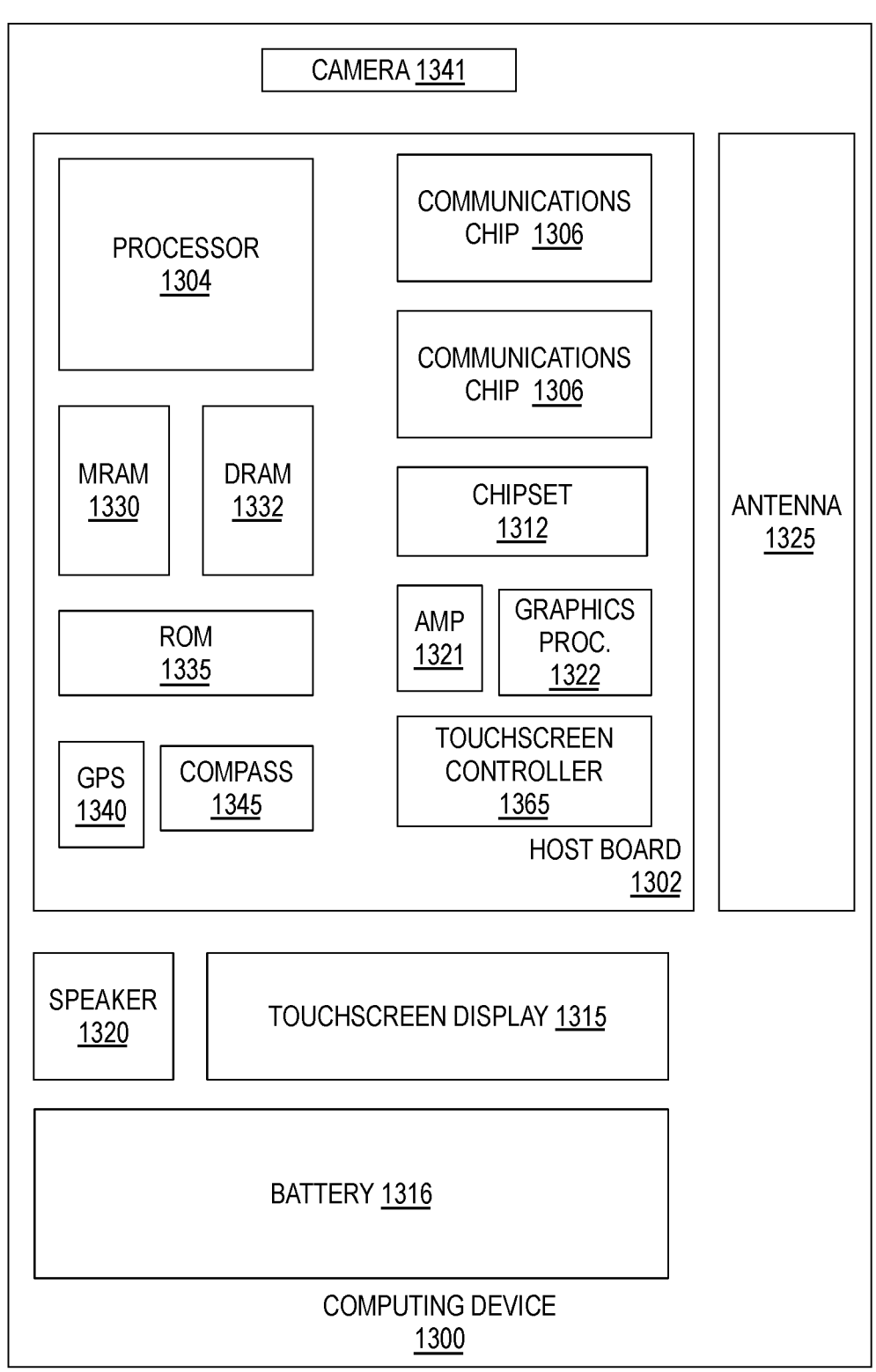
FIG. 13 is a functional block diagram of an electronic computing device, in accordance with some embodiments.

FIG. 13 is a functional block diagram of an electronic computing device 1300, in accordance with an embodiment of the present invention. Computing device 1300 may be found inside platform 1205 or server platform 1206, for example. Device 1300 further includes a host board 1302 hosting a number of components, such as, but not limited to, a processor 1304 (e.g., an applications processor). Processor 1304 may be physically and/or electrically coupled to motherboard 1302. In some examples, processor 1304 includes self-aligned staggered interconnect lines, for example as described elsewhere herein. In general, the term "processor" or "microprocessor" may refer to any device or portion of a device that processes electronic data from registers and/or memory to transform that electronic data into other electronic data that may be further stored in registers and/or memory.

In various examples, one or more communication chips 1306 may also be physically and/or electrically coupled to the motherboard 1302. In further implementations, communication chips 1306 may be part of processor 1304. Depending on its applications, computing device 1300 may include other components that may or may not be physically and electrically coupled to motherboard 1302. These other components include, but are not limited to, volatile memory (e.g., DRAM 1332), non-volatile memory (e.g., ROM 1335), flash memory (e.g., NAND or NOR), magnetic memory (MRAM 1330), a graphics processor 1322, a digital signal processor, a crypto processor, a chipset 1312, an antenna 1325, touchscreen display 1315, touchscreen controller 1365, battery 1316, audio codec, video codec, power amplifier 1321, global positioning system (GPS) device

1340, compass 1345, accelerometer, gyroscope, speaker 1320, camera 1341, and mass storage device (such as hard disk drive, solid-state drive (SSD), compact disk (CD), digital versatile disk (DVD), and so forth), or the like. In some exemplary embodiments, at least one of the functional blocks noted above include self-aligned staggered interconnect lines, for example as described elsewhere herein.

Communication chips 1306 may enable wireless communications for the transfer of data to and from the computing device 1300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1306 may implement any of a number of wireless standards or protocols, including but not limited to those described elsewhere herein. As discussed, computing device 1300 may include a plurality of communication chips 1306. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

It will be recognized that embodiments of the present invention are not limited to the specific examples described, but instead can be practiced with modification and alteration without departing from the scope of the appended claims. For example, the above embodiments may include specific combinations of features as further provided below.

In first examples, an integrated circuit (IC) interconnect structure comprises a plurality of first interconnect lines with spaces therebetween. The IC interconnect structure comprises a dielectric material over the first interconnect lines and within the spaces. Topography of the dielectric material comprises a plurality of trenches between the first interconnect lines. The IC interconnect structure comprises plurality of second interconnect lines interdigitated with the first interconnect lines. The second interconnect lines occupy at least a portion of each of the trenches between individual ones of the first interconnect lines.

In second examples, for any of the first examples the first interconnect lines are within a first plane of the structure and the second interconnect lines are within a second plane of the structure.

In third examples, for any of the second examples the interconnect structure comprises a plurality of third interconnect lines within a third plane of the structure. The third interconnect lines extend in a first direction substantially orthogonal to a second direction of the first and second interconnect lines.

In fourth examples, for any of the second examples the second plane is below the first plane.

In fifth examples, for any of the second examples the second plane is above the first plane.

In sixth examples, for any of the first examples a first ridge of the dielectric material over one of the first interconnect lines is substantially planar with a second ridge of the dielectric material over another of the first interconnect lines.

In seventh examples, for any of the sixth examples the second interconnect lines substantially fill the trenches and a top surface of one of the second interconnect lines between the first and second ridges is substantially planar with a top surface of the first and second ridges.

In eighth examples, for any of the sixth examples the second interconnect lines occupy only a bottom portion of the trenches and a top surface of one of the second interconnect lines between the first and second ridges is below a top surface of the first and second ridges.

In ninth examples, for any of the first through eighth examples a bottom surface of the trenches is below a bottom surface of the first interconnect lines.

In tenth examples, for any of the first through ninth examples the first and second interconnect lines have different chemical compositions.

In eleventh examples, for any of the first through tenth examples the first and second interconnect lines have substantially the same chemical composition.

In twelfth examples, for any of the first through eleventh examples the second interconnect lines comprise Cu.

In thirteenth examples, for any of the first through twelfth examples the first interconnect lines comprise predominantly W, R, Mo, or Co.

In fourteenth examples, for any of the first through thirteenth examples the dielectric material comprises a first material layer in contact with the first interconnect lines, and a second material layer on the first material layer, and wherein the first material layer comprises silicon and nitrogen.

In fifteenth examples, for any of the first through fourteenth examples the IC interconnect structure further comprises a plurality of interconnect vias within a third plane of the structure, over the second plane. A first of the interconnect vias intersects one of the first interconnect lines and a second of the interconnect vias intersects one of the second interconnect lines.

In sixteenth examples, an integrated circuit (IC) structure comprises a device layer comprising a plurality of transistors or memory cells, and an interconnect structure electrically coupled the device layer. The interconnect structure further comprises a plurality of first interconnect lines with spaces therebetween. The interconnect structure comprises a dielectric material over the first interconnect lines and within the spaces. Topography of the dielectric material comprises a plurality of trenches between the first interconnect lines. The interconnect structure comprises a plurality of second interconnect lines interdigitated with the first interconnect lines. The second interconnect lines occupy at least a portion of each of the trenches between individual ones of the first interconnect lines.

In seventeenth examples, for any of the sixteenth examples a computer platform comprises a power supply, and the IC structure is coupled to the power supply.

In eighteenth examples, for method of fabricating an interconnect structure, the method comprising forming first interconnect lines, forming trenches staggered from the first interconnect lines by depositing a dielectric material layer over the first interconnect lines and within spaces therebetween. Depositing metallization over a non-planar surface of the dielectric material layer, and forming parallel second interconnect lines by planarizing the metallization within the trenches with ridges of the non-planar dielectric material layer between the trenches.

In nineteenth examples, for any of the eighteenth examples the first interconnect lines are over a substrate material, and the method further comprises increasing a depth of the trenches by recess etching the substrate material between the first interconnect lines.

In twentieth examples, the method comprises forming the second interconnect lines further comprises recess etching the second interconnect lines after planarizing the metallization.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

What is claimed is:

1. An integrated circuit (IC) interconnect structure, comprising:
   a plurality of first interconnect lines with spaces therebetween;
   a dielectric material over the first interconnect lines and within the spaces, wherein topography of the dielectric material comprises a plurality of trenches between the first interconnect lines; and
   a plurality of second interconnect lines interdigitated with the first interconnect lines, wherein the second interconnect lines occupy at least a portion of the trenches between individual ones of the first interconnect lines, and wherein bottoms of the second interconnect lines are vertically offset above bottoms of the first interconnect lines by at least a first thickness of the dielectric material that is greater than a second thickness of the dielectric material between nearest edges of adjacent ones of the first and second interconnect lines.

2. The IC interconnect structure of claim 1, wherein:
   the first interconnect lines are within a first plane of the structure; and
   the second interconnect lines are within a second plane of the structure.

3. The IC interconnect structure of claim 2, further comprising a plurality of third interconnect lines within a third plane of the structure, wherein the third interconnect lines extend in a first direction substantially orthogonal to a second direction of the first and second interconnect lines.

4. The IC interconnect structure of claim 2, wherein the second plane is above the first plane.

5. The IC interconnect structure of claim 1, wherein the first thickness is at least 1.5 times the second thickness.

6. The IC interconnect structure of claim 1, wherein a first ridge of the dielectric material over one of the first interconnect lines is substantially planar with a second ridge of the dielectric material over another of the first interconnect lines.

7. The IC interconnect structure of claim 6, wherein the second interconnect lines substantially fill the trenches and a top surface of one of the second interconnect lines between the first and second ridges is substantially planar with a top surface of the first and second ridges.

8. The IC interconnect structure of claim 6, wherein the second interconnect lines occupy only a bottom portion of the trenches and a top surface of one of the second interconnect lines between the first and second ridges is below a top surface of the first and second ridges.

9. The IC interconnect structure of claim 1, wherein the first interconnect lines have line pitch, and wherein the first thickness is more than half of the line pitch.

10. The IC interconnect structure of claim 1, wherein the first and second interconnect lines have different chemical compositions.

11. The IC interconnect structure of claim 1, wherein the first and second interconnect lines have substantially the same chemical composition.

12. The IC interconnect structure of claim 1, wherein a first of the first or second interconnect lines comprise Cu.

13. The IC interconnect structure of claim 12, wherein a second of the first or second interconnect lines comprise predominantly W, Ru, Mo, or Co.

14. The IC interconnect structure of claim 1, wherein the dielectric material comprises a first material layer in contact with the first interconnect lines, and a second material layer on the first material layer, and wherein the first material layer comprises silicon and nitrogen.

15. The IC interconnect structure of claim 1, further comprising a plurality of interconnect vias within a third plane of the structure, over the second plane, wherein a first of the interconnect vias intersects one of the first interconnect lines and wherein a second of the interconnect vias intersects one of the second interconnect lines.

16. An integrated circuit (IC) structure, comprising:

a device layer comprising a plurality of transistors or memory cells; and an interconnect structure electrically coupled the device layer, wherein the interconnect structure further comprises:

a plurality of first interconnect lines with spaces therebetween;

a dielectric material over the first interconnect lines and within the spaces, wherein topography in the dielectric material defines a plurality of trenches between the first interconnect lines; and a plurality of second interconnect lines interdigitated with the first interconnect lines, wherein the second interconnect lines occupy at least a portion of each of the trenches between individual ones of the first interconnect lines, comprise predominantly W, Ru, Mo, or Co, and wherein a top surface of a first length of the one of the second interconnect lines is below a top surface of a second length of the one of the second interconnect lines.

17. The IC structure of claim 16, wherein the top surface of the first length is below a top surface of a length of one or more of the first interconnect lines.

18. A method of fabricating an interconnect structure, the method comprising:

forming first interconnect lines;

forming trenches staggered from the first interconnect lines by super-conformally depositing a non-planar dielectric material layer over the first interconnect lines and within spaces therebetween;

depositing metallization over a non-planar surface of the dielectric material layer; and forming parallel second interconnect lines by planarizing the metallization within the trenches with ridges of the non-planar dielectric material layer between the trenches, wherein bottoms of the second interconnect lines are vertically offset above bottoms of the first interconnect lines by a first thickness of the dielectric material that is greater than a second thickness of the dielectric material between nearest edges of adjacent ones of the first and second interconnect line.

19. The method of claim 18, wherein the first interconnect lines are over a substrate material, and the method further comprises increasing a depth of the trenches by recess etching the substrate material between the first interconnect lines.

20. The method of claim 18, wherein forming the second interconnect lines further comprises recess etching the second interconnect lines after planarizing the metallization.

* * * * *